United States Patent
Rezk et al.

(10) Patent No.: US 12,041,789 B2
(45) Date of Patent: *Jul. 16, 2024

(54) TECHNIQUES FOR FIBER TIP RE-IMAGING IN LIDAR SYSTEMS

(71) Applicant: AEVA, INC., Mountain View, CA (US)

(72) Inventors: Mina Rezk, Haymarket, VA (US);
Keith Gagne, Santa Clara, CA (US);
Neal N. Oza, Palo Alto, CA (US);
Omer P. Kocaoglu, Fremont, CA (US)

(73) Assignee: Aeva, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/565,347

(22) Filed: Dec. 29, 2021

(65) Prior Publication Data

US 2022/0123052 A1 Apr. 21, 2022

Related U.S. Application Data

(63) Continuation of application No. 17/307,896, filed on May 4, 2021, now Pat. No. 11,227,895, which is a
(Continued)

(51) Int. Cl.
*H10B 61/00* (2023.01)
*G11C 11/16* (2006.01)
(Continued)

(52) U.S. Cl.
CPC ............ *H10B 61/22* (2023.02); *G11C 11/161* (2013.01); *G11C 11/1659* (2013.01);
(Continued)

(58) Field of Classification Search
None
See application file for complete search history.

(56) References Cited

U.S. PATENT DOCUMENTS

| 7,382,443 B2 | 6/2008 | Ohtomo et al. |
| 11,002,835 B2 | 5/2021 | Pan et al. |

(Continued)

FOREIGN PATENT DOCUMENTS

| CN | 108445468 A | 8/2018 |
| CN | 207742332 U | 8/2018 |

(Continued)

OTHER PUBLICATIONS

International Search Report for International application No. PCT/US2019/052259, Mailed Nov. 29, 2019.
(Continued)

*Primary Examiner* — Luke D Ratcliffe
(74) *Attorney, Agent, or Firm* — Womble Bond Dickinson (US) LLP

(57) ABSTRACT

A light detection and ranging (LIDAR) system is provided that includes an optical source to generate and transmit an optical beam, an optical fiber to guide the optical beam to a fiber tip from which the optical beam is emitted, and a first scanning mirror rotatable along at least one axis to steer the optical beam to scan a scene, and collect light incident upon objects in the scene. The system further includes a first lens, disposed between the optical fiber and the first scanning mirror, to focus the optical beam emitted from the optical fiber to converge at a location near a center of rotation of the first scanning mirror, the first scanning mirror to reflect the optical beam towards an optic, the optic, disposed between the first scanning mirror and the scene, to collimate or focus the optical beam reflected from the first scanning mirror, and a signal processor to determine a range of one or more of the objects from a return signal reflected from the one or more of the objects.

20 Claims, 11 Drawing Sheets

Related U.S. Application Data continuation of application No. 16/169,633, filed on Oct. 24, 2018, now Pat. No. 11,024,669.

(51) Int. Cl.
  *H01F 10/32* (2006.01)
  *H10N 50/10* (2023.01)
  *H10N 50/85* (2023.01)

(52) U.S. Cl.
  CPC ...... *G11C 11/1675* (2013.01); *H01F 10/3286* (2013.01); *H01F 10/329* (2013.01); *H10N 50/10* (2023.02); *H10N 50/85* (2023.02)

(56) References Cited

U.S. PATENT DOCUMENTS

| | | | |
|---|---|---|---|
| 2011/0228249 A1 | 9/2011 | Koehler et al. | |
| 2013/0054187 A1* | 2/2013 | Pochiraju | G01S 7/4817 |
| | | | 702/150 |
| 2015/0198433 A1 | 7/2015 | Saint Clair et al. | |
| 2017/0113599 A1* | 4/2017 | Park | G02B 26/0833 |
| 2017/0307876 A1* | 10/2017 | Dussan | G02B 27/14 |
| 2018/0128904 A1* | 5/2018 | Haslim | G01S 7/4818 |
| 2018/0143308 A1 | 5/2018 | Vlaiko et al. | |

FOREIGN PATENT DOCUMENTS

| | | |
|---|---|---|
| EP | 2720074 A2 | 4/2014 |
| JP | S63218886 A | 9/1988 |
| JP | 2007 170902 A | 7/2007 |

OTHER PUBLICATIONS

Decision to Grant dated Jun. 5, 2023 re: related JP Patent Application No. 2021-523059 with filing date of Apr. 26, 2021 (with translation); 5 pages.

The Korean Intellectual Property Office "Notice of Allowance," for the Patent Application No. 10-2021-7015365, dated Apr. 19, 2024, pp. 1-3.

* cited by examiner

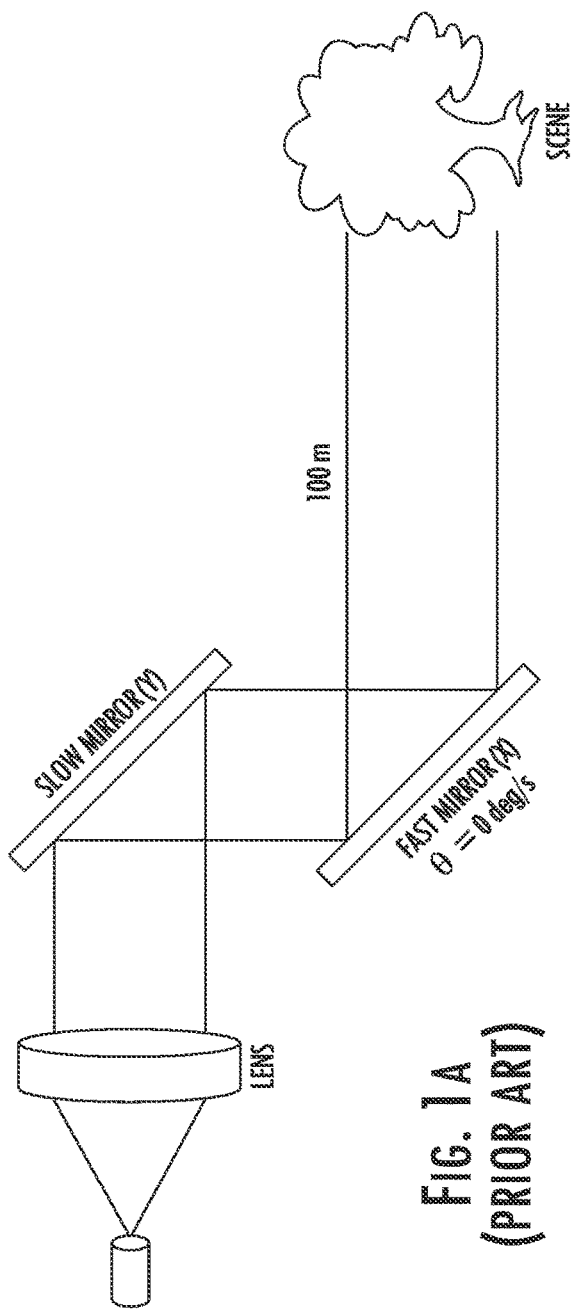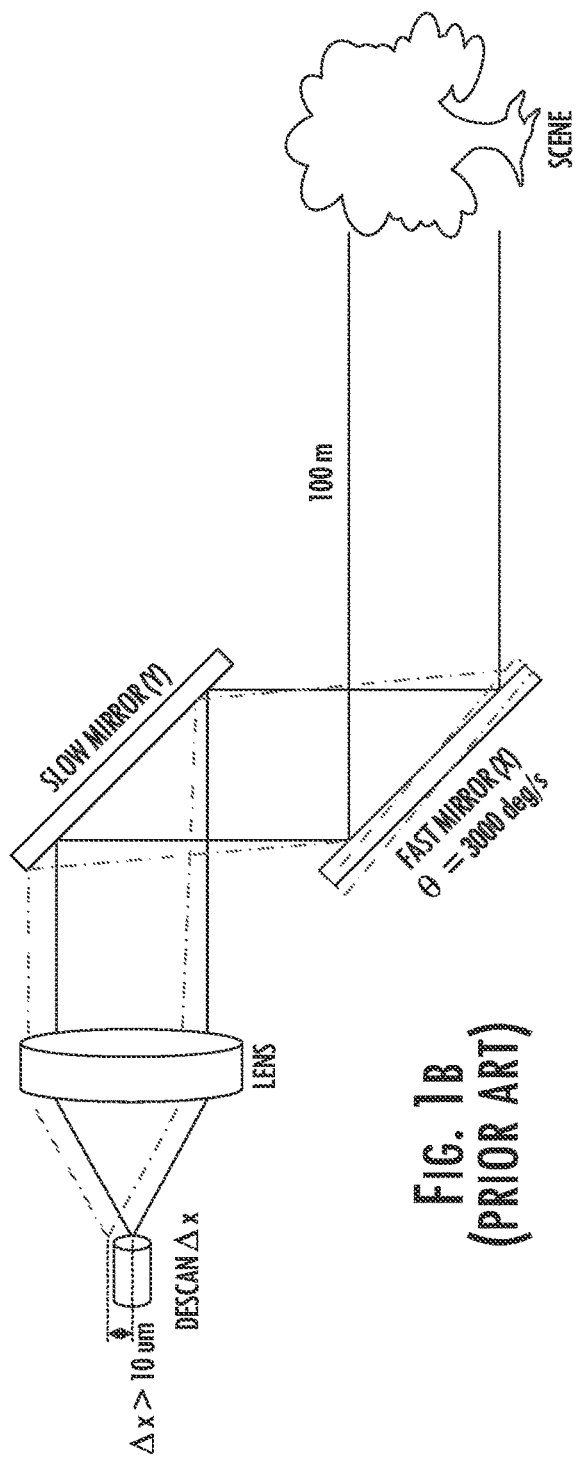
FIG. 1A (PRIOR ART)
FIG. 1B (PRIOR ART)

TECHNIQUES FOR FIBER TIP RE-IMAGING IN LIDAR SYSTEMS

CROSS-REFERENCE TO RELATED APPLICATIONS

This application is a continuation of U.S. patent application Ser. No. 17/307,896, filed May 4, 2021, which is a continuation of U.S. patent application Ser. No. 16/169,633, filed Oct. 24, 2018, now U.S. Pat. No. 11,024,669, issued Jun. 1, 2021, which are hereby incorporated by reference in its entirety.

TECHNOLOGICAL FIELD

The present disclosure relates generally to light detection and ranging (LIDAR) and, in particular, to multiple-wavelength LIDAR that provides simultaneous measurement of range and velocity across two dimensions.

BACKGROUND

Fast-scanning mirrors are the primary components used to illuminate a scene in most LIDAR systems today. As shown in FIG. 1A, one mirror typically scans fast along the X direction (horizon), while another mirror scans slow along the Y direction (elevation). Upon target reflection, the same channel that emitted the light detects the light, typically a single mode fiber. The collected light has an altered frequency signature that is used to extract range information. Processing range information combined with angle feedback from the galvanometer (galvo) motor can form a 3D point cloud.

To increase the frame rate, while maintaining the same number of points per frame, the X galvo speed is increased. Scanning the galvos faster than 100 Hz at long ranges (>3000 degrees per second) severely degrades the target signal. This is because during the time the laser signal (frequency sweep) propagates to the distant target and returns to the scanning system, the mirror moves due to its high rotational velocity. As shown in FIG. 1B, this slight angle deviation of the fast scanning mirror causes a misalignment of the target signal at the fiber tip. For systems with a small fiber tip core diameter, e.g. the ~10-um diameter for typical single mode fiber, such an offset can have significant degradation of detected signal strength. FIG. 2 shows a plot of fiber coupling efficiency versus scanning mirror's rotational velocity in a typical LIDAR system.

BRIEF SUMMARY

Example implementations of the present disclosure are directed to an improved scanner for a LIDAR system with coherent detection. Example implementations of the present disclosure are based on a type of LIDAR that uses frequency modulation (FM) and coherent detection to overcome the shortcomings of traditional LIDAR systems and the limitations of prior FM LIDAR systems. Historically, FM LIDAR systems suffer from significant losses in the beam's return path; thus, such systems, which are often quite bulky, require a higher beam output power to measure distances comparable to time-of-flight (TOF) LIDAR systems. Alas, the range is limited by the operating distance for eye-safe output powers.

Example implementations of the present disclosure are configured to simultaneously measure the range and velocity, using coherent detection and having the added benefit of immunity to crosstalk from other LIDAR systems. Example implementations minimize optical losses in the beam's return path, thereby increasing the system's measurement range. Additionally, by using nondegenerate laser sources, example implementations can leverage mature wavelength division multiplexing (WDM) techniques often used in integrated silicon photonics, a desired platform due to its compactness and relative stability in varying environmental conditions.

As described above, the decenter at the fiber tip upon return of the target signal is the primary source of the fiber coupling degradation described above. Example implementations of the present disclosure remove this decenter error by re-imaging the fiber tip onto the fast scanning mirror. In accordance with example implementations, the fiber tip is artificially placed at or close to the center of rotation of the scanning mirror, and any rotation about this point is observed as a tilt, not a decenter.

Another benefit of example implementations is that the mirror on which the fiber tip is re-imaged can be made extremely small and two-dimensional (2D) microelectromechanical systems (MEMS) mirrors may be used. This eliminates the need for a second Y mirror and reduces the overall size of the system. This configuration would still be followed by a collimating lens.

The present disclosure thus includes, without limitation, the following example implementations.

Some example implementations provide a light detection and ranging (LIDAR) system comprising an active optical circuit configured to generate a laser beam, and detect a return laser beam; an optical scanning system including at least: an optical fiber configured to guide a laser beam to a fiber tip from which the laser beam is emitted; a scanning mirror rotatable along at least one axis to steer the laser beam to scan a scene, and collect light incident upon any objects in the scene into a return laser beam that is returned to the fiber tip, the optical fiber being configured to guide the return laser beam from the fiber tip to the active optical circuit; a re-imaging lens located between the optical fiber and scanning mirror, and configured to focus the laser beam emitted from the optical fiber onto the scanning mirror at or close to a center of rotation of the scanning mirror and thereby re-image the fiber tip at or close to the center of rotation, the scanning mirror being configured to reflect the laser beam as a divergent laser beam; and an optic located between the scanning mirror and the scene, and configured to collimate or focus the divergent laser beam from the scanning mirror to produce a collimated or focused laser beam that is launched toward the scene; and a signal processor configured to determine a range of the target from the return laser beam.

In some example implementations of the LIDAR system of any preceding example implementation, or any combination of preceding example implementations, the optic of the optical scanning system is a collimator configured to collimate the divergent laser beam from the scanning mirror to produce a collimated laser beam that is launched toward the scene.

In some example implementations of the LIDAR system of any preceding example implementation, or any combination of preceding example implementations, the optic of the optical scanning system is a focus lens configured to focus the divergent laser beam from the scanning mirror to produce a focused laser beam that is launched toward the scene.

In some example implementations of the LIDAR system of any preceding example implementation, or any combination of preceding example implementations, the scanning mirror of the optical scanning system is rotatable along multiple orthogonal axes to steer the laser beam in multiple dimensions to scan the scene.

In some example implementations of the LIDAR system of any preceding example implementation, or any combination of preceding example implementations, the scanning mirror of the optical scanning system is a first scanning mirror, and the optical scanning system further comprises a second scanning mirror, the first scanning mirror and the second scanning mirror being rotatable along orthogonal axes to steer the laser beam in multiple dimensions to scan the scene, the first scanning mirror being rotatable with a faster angular velocity than the second scanning mirror to scan the scene.

Some example implementations provide an optical scanning system comprising an optical fiber configured to guide a laser beam to a fiber tip from which the laser beam is emitted; a scanning mirror rotatable along at least one axis to steer the laser beam to scan a scene, and collect light incident upon any objects in the scene into a return laser beam that is returned to the fiber tip, the optical fiber being configured to guide the return laser beam from the fiber tip; a re-imaging lens located between the optical fiber and scanning mirror, and configured to focus the laser beam emitted from the optical fiber onto the scanning mirror at or close to a center of rotation of the scanning mirror and thereby re-image the fiber tip at or close to the center of rotation, the scanning mirror being configured to reflect the laser beam as a divergent laser beam; and an optic located between the scanning mirror and the scene, and configured to collimate or focus the divergent laser beam from the scanning mirror to produce a collimated or focused laser beam that is launched toward the scene.

In some example implementations of the optical scanning system of any preceding example implementation, or any combination of preceding example implementations, the optic is a collimator configured to collimate the divergent laser beam from the scanning mirror to produce a collimated laser beam that is launched toward the scene.

In some example implementations of the optical scanning system of any preceding example implementation, or any combination of preceding example implementations, the optic is a focus lens configured to focus the divergent laser beam from the scanning mirror to produce a focused laser beam that is launched toward the scene.

In some example implementations of the optical scanning system of any preceding example implementation, or any combination of preceding example implementations, the scanning mirror is rotatable along multiple orthogonal axes to steer the laser beam in multiple dimensions to scan the scene.

In some example implementations of the optical scanning system of any preceding example implementation, or any combination of preceding example implementations, the optic is a collimator configured to collimate the divergent laser beam from the scanning mirror to produce a collimated laser beam that is launched toward the scene.

In some example implementations of the optical scanning system of any preceding example implementation, or any combination of preceding example implementations, the optic is a focus lens configured to focus the divergent laser beam from the scanning mirror to produce a focused laser beam that is launched toward the scene.

In some example implementations of the optical scanning system of any preceding example implementation, or any combination of preceding example implementations, the scanning mirror is a first scanning mirror, and the optical scanning system further comprises a second scanning mirror, the first scanning mirror and the second scanning mirror being rotatable along orthogonal axes to steer the laser beam in multiple dimensions to scan the scene, the first scanning mirror being rotatable with a faster angular velocity than the second scanning mirror to scan the scene.

In some example implementations of the optical scanning system of any preceding example implementation, or any combination of preceding example implementations, the first scanning mirror is rotatable along an azimuth axis, and the second scanning mirror is rotatable along an elevation axis, to scan the scene.

In some example implementations of the optical scanning system of any preceding example implementation, or any combination of preceding example implementations, the optic is located between the first scanning mirror and the second scanning mirror.

In some example implementations of the optical scanning system of any preceding example implementation, or any combination of preceding example implementations, the optic is a collimator configured to collimate the divergent laser beam from the first scanning mirror to produce a collimated laser beam that is reflected by the second scanning mirror and launched toward the scene.

In some example implementations of the optical scanning system of any preceding example implementation, or any combination of preceding example implementations, the optic is a focus lens configured to focus the divergent laser beam from the first scanning mirror to produce a focused laser beam that is reflected by the second scanning mirror and launched toward the scene.

In some example implementations of the optical scanning system of any preceding example implementation, or any combination of preceding example implementations, the second scanning mirror is located between the first scanning mirror and the scene, and the optic is located between the second scanning mirror and the scene, and thereby between the first scanning mirror and the scene.

In some example implementations of the optical scanning system of any preceding example implementation, or any combination of preceding example implementations, the optic is a collimator configured to collimate the divergent laser beam from the second scanning mirror to produce a collimated laser beam that is launched toward the scene.

In some example implementations of the optical scanning system of any preceding example implementation, or any combination of preceding example implementations, the optic is a focus lens configured to focus the divergent laser beam from the second scanning mirror to produce a focused laser beam that is reflected launched toward the scene.

In some example implementations of the optical scanning system of any preceding example implementation, or any combination of preceding example implementations, the laser beam is multiple laser beams, and the optical fiber is an array of optical fibers configured to guide the multiple laser beams to fiber tips from which the multiple laser beams are emitted.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

FIGS. 1A and 1B illustrate an optical scanning system of a typical light detection and ranging (LIDAR) system to steer a laser beam to scan a scene, and illustrating decentering of the return laser beam at the fiber tip;

DETAILED DESCRIPTION

Figure 2:
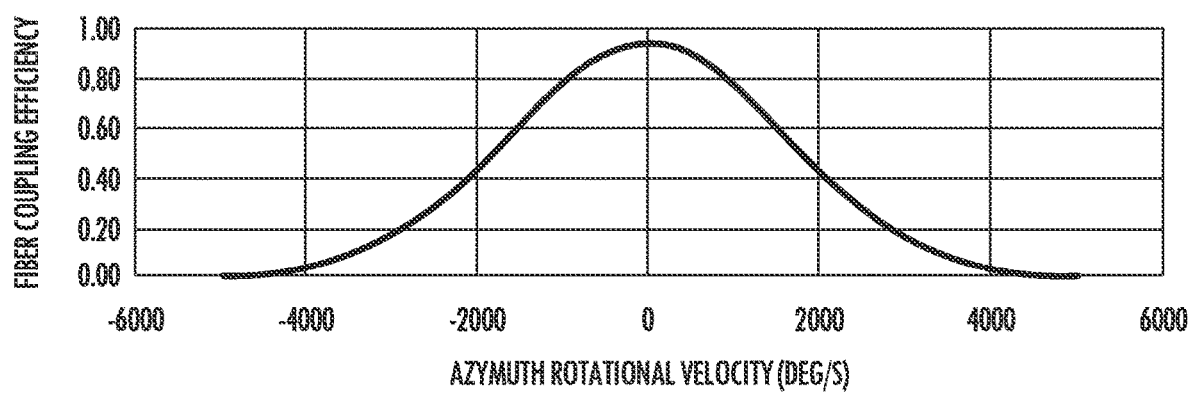
FIG. 2 is a plot of fiber coupling efficiency versus rotational scanning mirror velocity in a typical LIDAR system.

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are directed to an improved LIDAR system. The LIDAR system may be implemented in any sensing environment, such as, but not limited to, transportation, manufacturing, metrology, medical, and security systems. For example, in the automotive industry, such a device can assist with spatial awareness for automated driver assist systems, or self-driving vehicles. Additionally, it can help with velocity calibration of a moving vehicle without the need for a separate inertial movement unit (IMU). In other examples, the LIDAR system may provide data that can be used for analysis of defects, diagnostics, image processing, or other applications.

Figure 3:
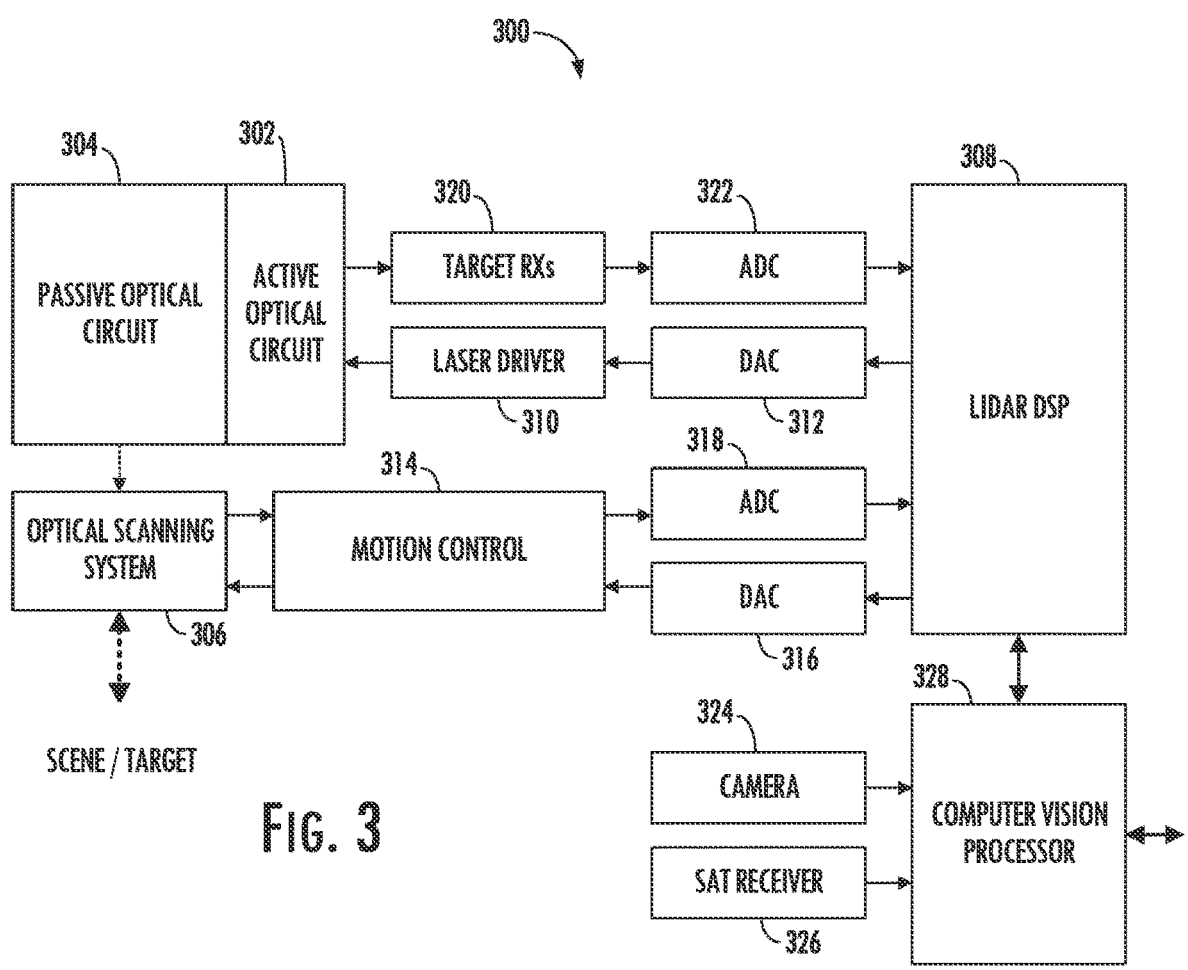
FIG. 3 illustrates a LIDAR system according to example implementations of the present disclosure.

FIG. 3 illustrates a LIDAR system 300 according to example implementations of the present disclosure. The LIDAR system includes one or more of each of a number of components. A number of example components are illustrated and described herein. It should be understood that in various implementations, the LIDAR system may omit one or more of the components, or include additional or alternative components than those illustrated and described herein. As shown, the LIDAR system includes an active optical circuit 302 configured to generate, amplify and detect optical signals and the like. In some examples, the active optical circuit includes lasers at different wavelengths, an optical amplifier, and photodetectors.

The LIDAR system 300 includes a passive optical circuit 304 with one or more waveguides to route and manipulate optical signals to appropriate input/output ports of the active optical circuit 302. The passive optical circuit may include one or more optical components such as taps, wavelength division multiplexers (WDMs), splitters/combiners, polarizing beam splitters (PBSs), Mach-Zehnder interferometers, modulators, optical attenuators, circulators, collimators and the like.

An optical scanning system 306 includes one or more scanning mirrors that are rotatable by galvanometers (galvos) along respective orthogonal axes to steer optical signals to scan a scene according to a scanning pattern. The optical scanning system also collects light incident upon any objects in the scene into a return laser beam that is returned to the passive optical circuit 304. In addition to the mirrors and galvos, the optical scanning system may include components such as waveplates, lenses, spectral filters, anti-reflective (AR)-coated windows and the like.

To control and support the active optical circuit 302, passive optical circuit 304 and optical scanning system 306, the LIDAR system 300 includes a LIDAR digital signal processor (DSP) 308 configured to function as the central processing unit for the system. The LIDAR DSP is configured to output digital control signals for a laser driver 310 configured to modulate the lasers to provide an optical signal. A digital-to-analog converter (DAC) 312 may provide signals to the laser driver.

The LIDAR DSP 308 is configured to output digital control signals for the optical scanning system 306. A motion control software subsystem 314 may control the galvos of the optical scanning system. A DAC 316 may convert coordinate routing information from the LIDAR DSP to signals interpretable by the galvos. An analog-to-digital converter (ADC) 318 may in turn convert information about the galvos' position to a signal interpretable by the LIDAR DSP.

The LIDAR DSP 308 is further configured to analyze incoming digital signals. In some examples, target receivers 320 measure the optical signal that carries information about the range of a target. In other examples, the target receivers measure the optical signal that carries information about the range and velocity of a target in the form of a beat frequency, modulated optical signal. In some examples, the LIDAR DSP is configured to determine or otherwise produce multiple measurements of range, or range and velocity, of the target or the scene including the target from multiple signals or a periodic signal, and produce a multi-dimensional (e.g., 3D, 4D) representation of the scene—such as a multi-dimensional point cloud—from the measurements. An ADC 322 converts signals from the target receivers to signals interpretable by the LIDAR DSP.

In some applications, the LIDAR system 300 may additionally include a camera 324 configured to capture images of the scene, and a satellite-based navigation receiver 326 configured to provide a geographic location of the system. A computer vision processor 328 is configured to receive the images and geographic location, and send the images and location or information related thereto to the LIDAR DSP 308.

In operation according to some examples, the LIDAR system 300 is configured to use nondegenerate laser sources to simultaneously measure range and velocity across two dimensions. This capability allows for real-time, long range 4D measurements (range, velocity, azimuth, and elevation) of the surrounding environment (a scene). The system points multiple modulated laser beams to the same target.

In some examples, the scanning process begins with the laser driver 310 and LIDAR DSP 308. The LIDAR DSP instructs the laser driver to independently modulate the lasers, and these modulated signals propagate through the passive optical circuit 304 to the collimator. The collimator directs the light to the optical scanning system 306 that scans the environment over a preprogrammed pattern defined by the motion control software subsystem 314.

The collected optical signals pass through the optical circuits 304, 302 to the target receivers 320. In some examples, the LIDAR system 300 includes two target receivers per beam. The target receivers measure the optical signals encoded with range and velocity information about the environment. Each beam signal that returns from the target produces a time-shifted waveform. The temporal phase difference between the two waveforms generates a beat frequency measured on the photodetectors in the active optical circuit 302.

The analog signals from the target receivers 320 are converted to digital signals using ADC 322. The digital signals are then sent to the LIDAR DSP 308. The LIDAR DSP 308 also receives position data from the motion control software subsystem 314 and galvos as well as image data from the computer vision processor 328.

The computer vision processor 328 collects two-dimensional (2D) images from the camera 324 and sends the data to the LIDAR DSP 308. The system software then overlays the multi-dimensional representation (e.g., 4D point cloud) with the image data to determine velocity and distance of objects in the surrounding area. The system also processes the satellite-based navigation location data to provide a precise global location.

Figure 4:
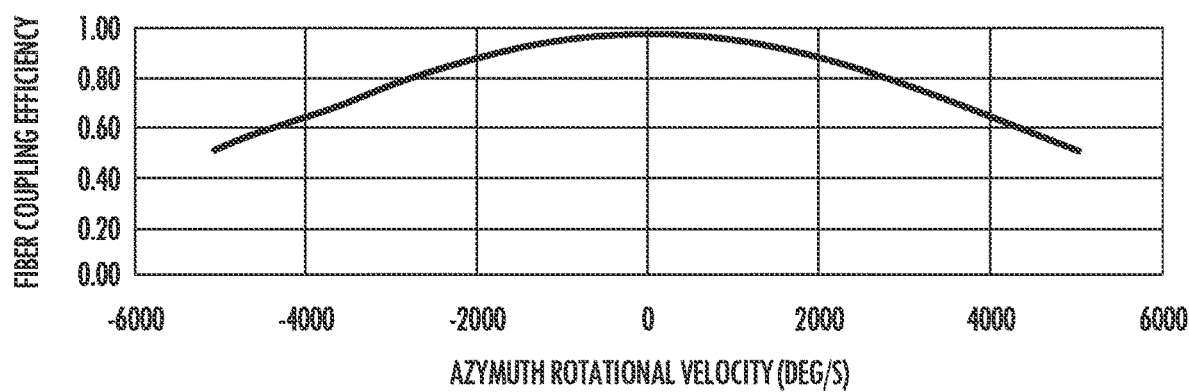
FIG. 4 is a plot of fiber coupling efficiency versus rotational scanning mirror velocity in the LIDAR system of FIG. 3, according to some example implementations.

As explained in the Background and Brief Summary section, traditional LIDAR systems suffer from degraded target signals when the scanning mirrors are rotated with an increased rotational speed. During the time it takes a laser signal (frequency sweep) to reach the target and return to the scanning system, the mirror has moved due to its rotational velocity, and this slight angle deviation of the fast scanning mirror causes misalignment of the target signal at the fiber tip. Example implementations of the present disclosure remove this decenter error by re-imaging the fiber tip onto one of the scanning mirrors, such as the fast scanning mirror. In accordance with example implementations, the fiber tip is artificially placed at or close to the center of rotation of the scanning mirror, and any rotation about this point is observed as a tilt, not a decenter. FIG. 4 shows a plot of fiber coupling efficiency versus rotational scanning mirror velocity in the LIDAR system of FIG. 3, according to some example implementations of the present disclosure.

Figure 5:
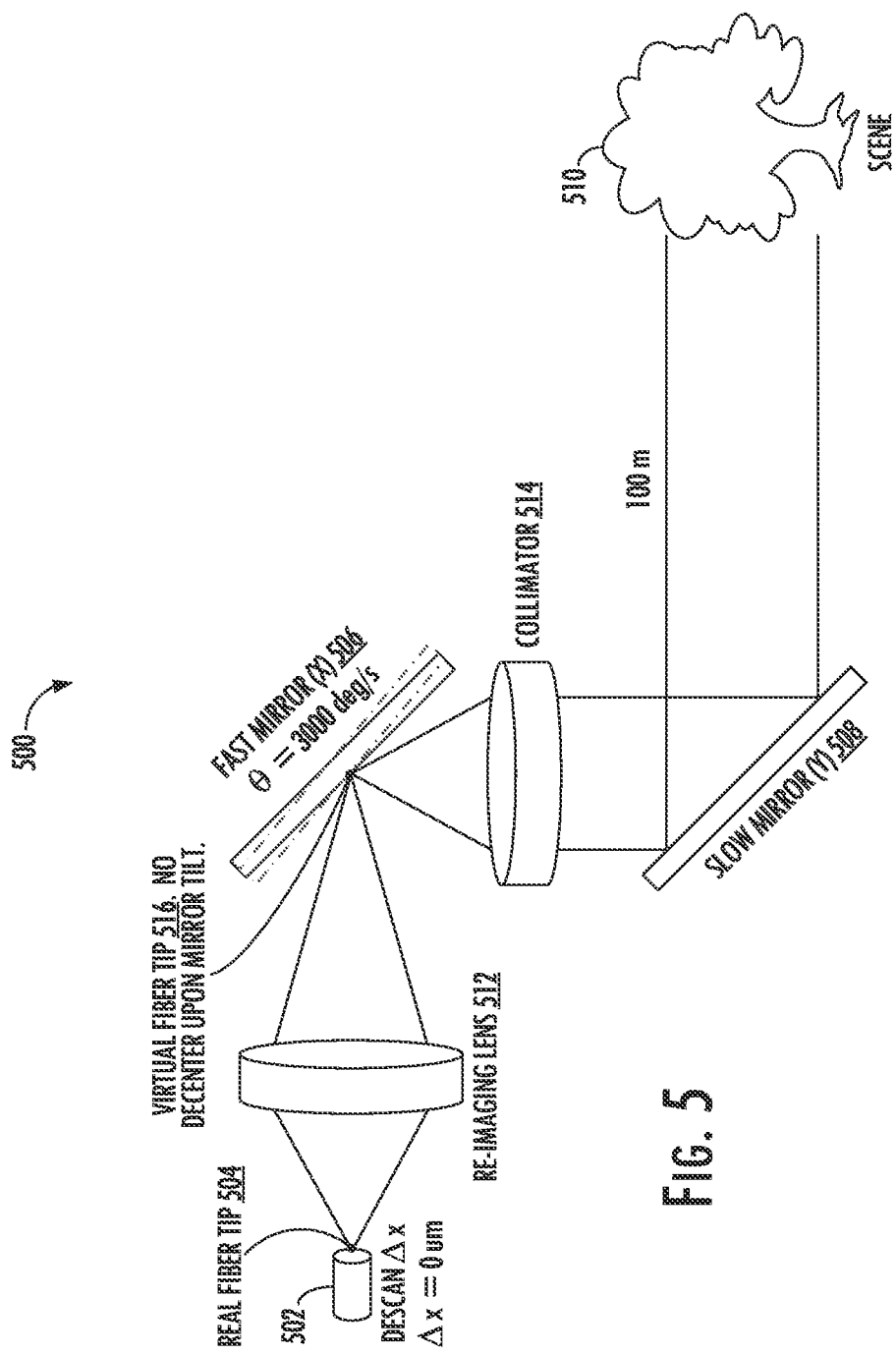
FIGS. 5, 6, 7, 8, 9 and 10 illustrate aspects of the optical scanning system of the LIDAR system of FIG. 3, according to various example implementations.

FIG. 5 illustrates an optical scanning system 500 that may correspond to the optical scanning system 306 of the LIDAR system 300 of FIG. 3, according to some example implementations. As shown, an optical fiber 502 is configured to guide a laser beam to a fiber tip 504 from which the laser beam is emitted. The optical scanning system includes a pair of mirrors 506, 508—later identified as first scanning mirror and second scanning mirror—that rotate along orthogonal axes to steer the laser beam across a scene 510 according to a scanning pattern. The same system collects light reflected by all objects in the scene into the fiber tip. The optical fiber guides the return laser beam from the fiber tip to a photodetector (e.g., in the active optical circuit 302) that is configured to detect the return signal.

As also shown, the optical scanning system 500 further includes a re-imaging lens 512 between the optical fiber and the first scanning mirror, and a collimator 514 between the first scanning mirror 506 and the second scanning mirror 508. The re-imaging lens focuses the laser beam emitted from the optical fiber 502 on or close to the first scanning mirror's center of rotation 516, thereby re-imaging the fiber tip at or close to the center of rotation. The first scanning mirror reflects the laser beam as a divergent laser beam toward a collimating lens. This lens collimates the divergent laser beam which is subsequently reflected by the second scanning mirror toward the scene.

In some examples, as shown, the first scanning mirror 506 is rotatable with a faster angular velocity than the second scanning mirror 508 to scan the scene according to the scanning pattern. As also shown, the first scanning mirror may be rotatable along an azimuth axis (x-axis), and the second scanning mirror may be rotatable along an elevation axis (y-axis), to scan the scene according to the scanning pattern.

In some examples, the collimator 514 may be more generally located between the fast scanning mirror 506 and the scene 510. In examples including the two scanning mirrors 506, 508 such as shown, this may include the collimator located between them. In other examples, the collimator may be located between the second scanning mirror 508 and the scene 510.

In some examples the collimator 514 may be replaced with a focus lens configured to focus the divergent laser beam from the scanning mirror to produce a focused laser beam. The optical scanning system 500, then, may more generally include an optic that is configured to collimate or focus the divergent laser beam.

Figure 6:
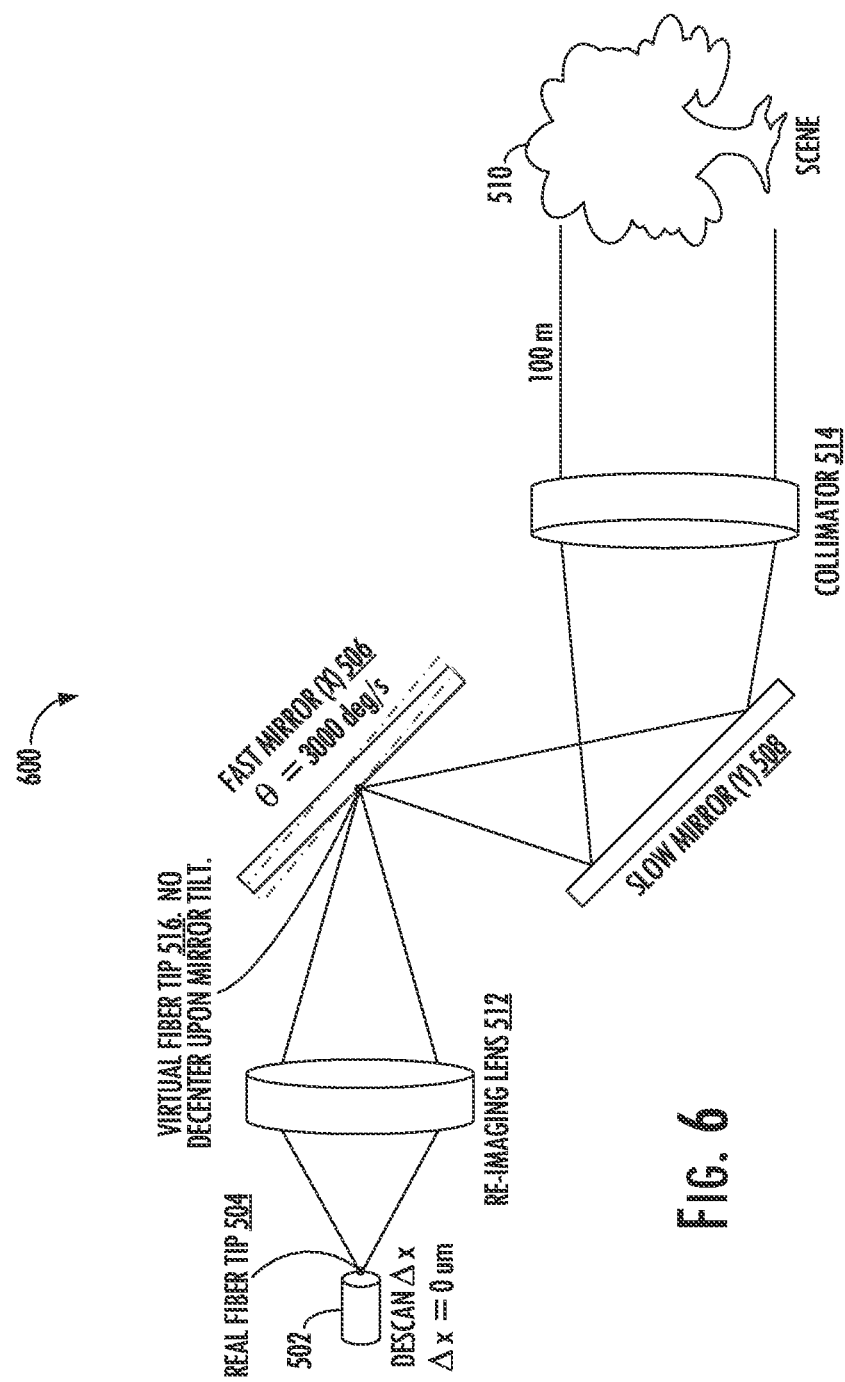

Many modifications and other implementations of the disclosure set forth herein will come to mind to one skilled in the art to which the disclosure pertains having the benefit of the teachings presented in the foregoing description and the associated figures. Other suitable configurations of the optical scanning system are shown in FIGS. 6-10. In the optical scanning system shown in FIG. 5, the collimator is located between the scanning mirrors, or between the first scanning mirror and the scene. In other example implementations, the collimator is located still between the first scanning mirror and the scene, but it is also located between the second scanning mirror and the scene. This is shown in FIG. 6 for another optical scanning system 600 that may correspond to the optical scanning system 306 of the LIDAR system 300 of FIG. 3, according to some example implementations.

Figure 7:
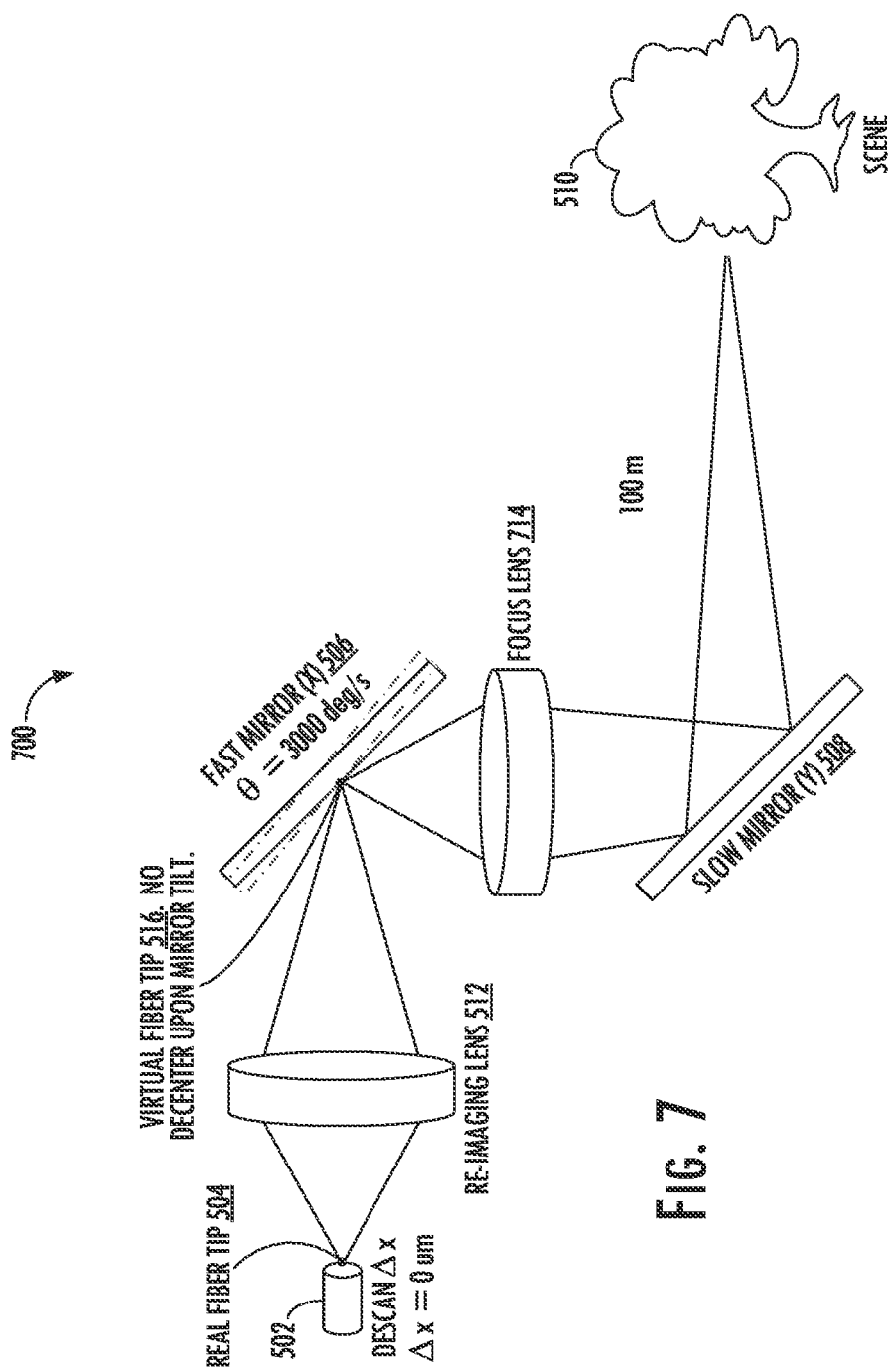
Figure 8:
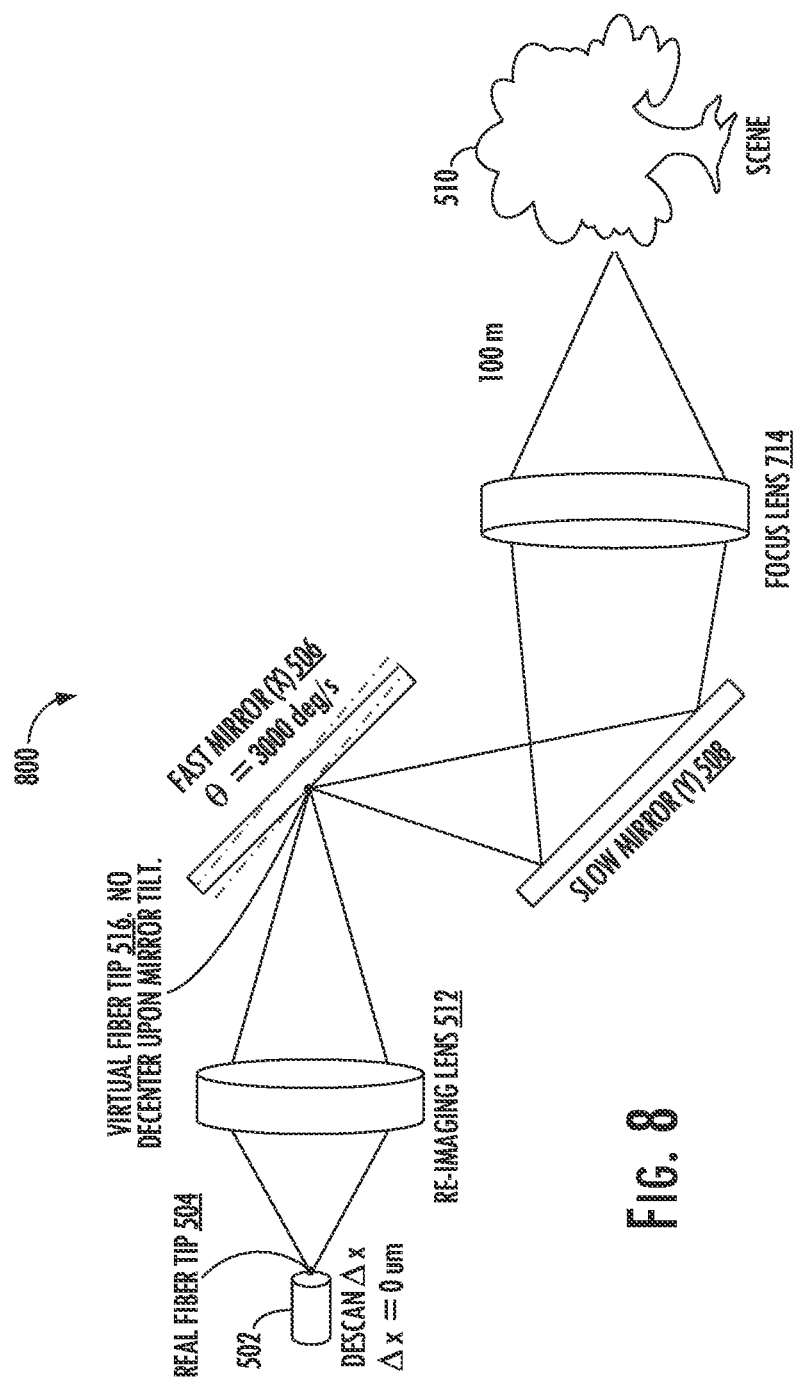

As shown in FIGS. 7 and 8, in some example implementations, the optical scanning system 700, 800 includes a focus mirror 714 in place of the collimator 514, which may be located similar to the collimator in other example implementations. The optical scanning system of various example implementations, then, may more generally include an optic that is configured to collimate or focus the divergent laser beam.

Figure 9:
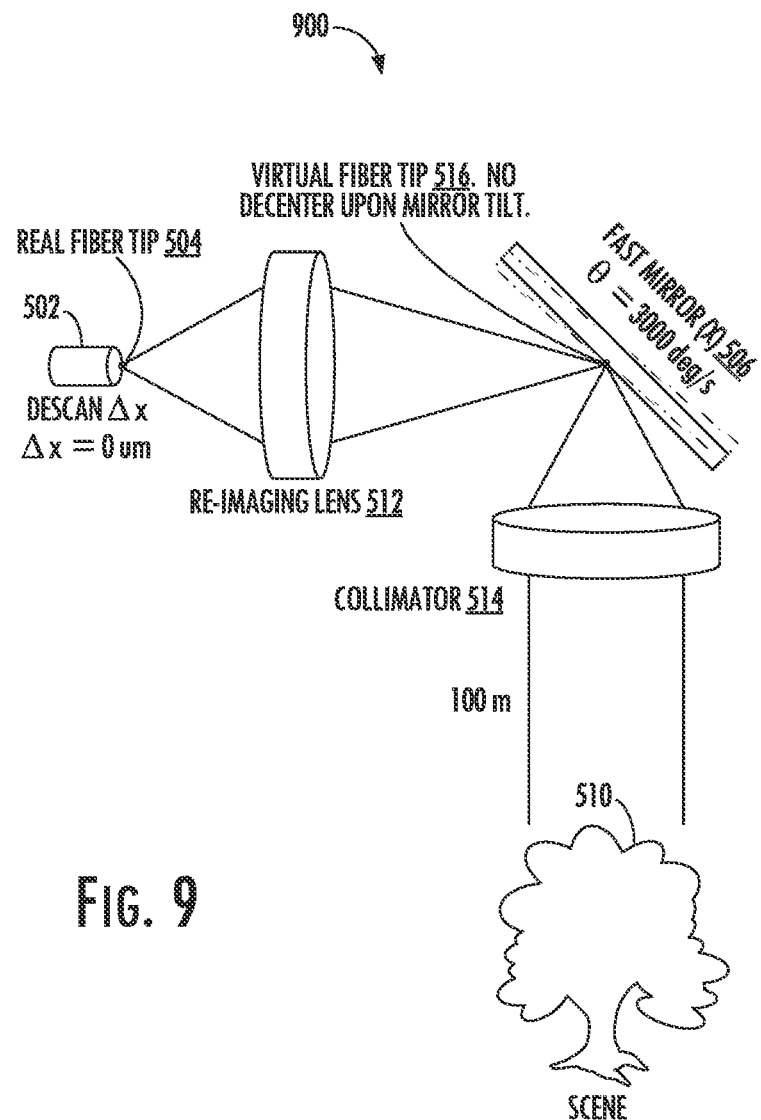
Figure 10:
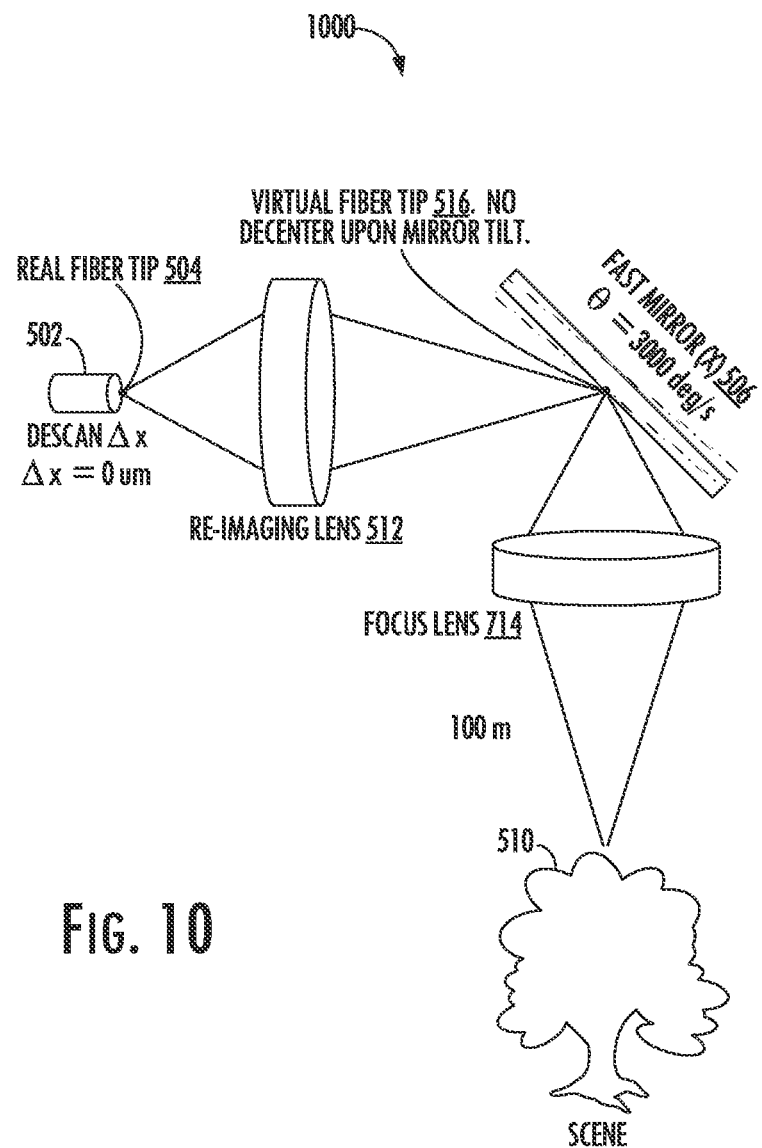

In other example implementations, the optical scanning system includes more or less than the two scanning mirrors shown in FIGS. 5-8. In some of these example implementations, the optical scanning system includes a scanning mirror rotatable along multiple orthogonal axes to steer the laser beam in multiple dimensions to scan the scene. These examples may similarly include an optic between the scanning mirror and the scene, such as a collimator or focus lens. Examples including a multi-dimensional scanning mirror are shown in FIGS. 9 and 10, which illustrate optical scanning system 900, 1000.

Figure 11:
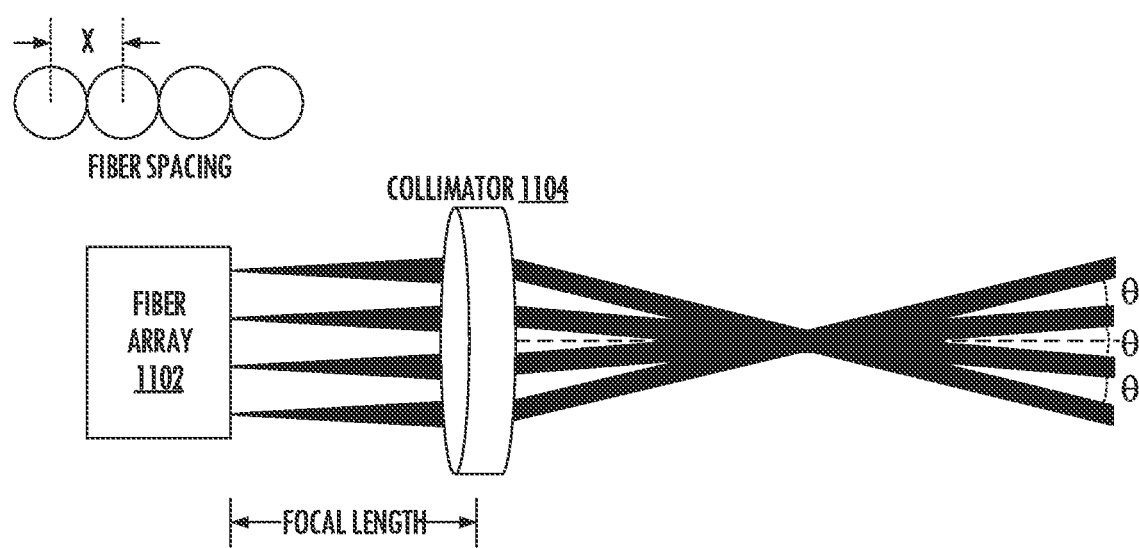
FIG. 11 illustrates the LIDAR system of FIG. 3 configured with multiple beams, according to some example implementations.

In yet other example implementations, the optical scanning system may generate and detect multiple laser beams. In some of these examples, the laser beam is multiple laser beams, and the optical fiber is an array of optical fibers coupled to the active optical circuit and configured to guide the multiple laser beams to fiber tips from which the multiple laser beams are emitted. In these examples, the angle separation between the laser beams may be a function of the focal length from the array to the optic and fiber spacing. An example of an array 1102 and collimator 1104 for multiple laser beams is shown in FIG. 11.

It is therefore to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A light detection and ranging (LIDAR) system comprising:
    an optical source to generate and transmit an optical beam;
    an optical fiber to guide the optical beam to a fiber tip from which the optical beam is emitted;
    a first scanning mirror rotatable along at least one axis to steer the optical beam to scan a scene, and collect light incident upon objects in the scene;
    a first lens, disposed between the optical fiber and the first scanning mirror, configured with a focal point to focus the optical beam emitted from the optical fiber to converge at a location near a center of rotation of the first scanning mirror, the first scanning mirror to reflect the optical beam towards an optic;
    the optic, disposed between the first scanning mirror and the scene, to collimate or focus the optical beam reflected from the first scanning mirror; and
    a signal processor to determine a range of one or more of the objects from a return signal reflected from the one or more of the objects.

2. The LIDAR system of claim 1, wherein the optical beam is reflected from the first scanning mirror as a divergent optical beam.

3. The LIDAR system of claim 2, wherein the optic comprises a collimating lens to collimate the divergent optical beam from the first scanning mirror to produce a collimated laser beam that is directed toward the scene.

4. The LIDAR system of claim 2, wherein the optic comprises a focus lens to focus the divergent optical beam from the first scanning mirror to produce a focused laser beam that is directed toward the scene.

5. The LIDAR system of claim 2, wherein the optic comprises a focus mirror to collimate the divergent optical beam from the first scanning mirror to produce a collimated laser beam that is directed toward the scene.

6. The LIDAR system of claim 1, wherein the first scanning mirror of the optical scanning system is rotatable along multiple orthogonal axes to steer the optical beam in multiple dimensions to scan the scene.

7. The LIDAR system of claim 1, further comprising a second scanning mirror, wherein the optic is disposed between the first scanning mirror and the second scanning mirror.

8. The LIDAR system of claim 7, wherein the second scanning mirror directs the optical beam toward the scene.

9. The LIDAR system of claim 7, wherein the first scanning mirror and the second scanning mirror are rotatable along orthogonal axes to steer the optical beam in multiple dimensions to scan the scene, the first scanning mirror being rotatable with a faster angular velocity than the second scanning mirror to scan the scene.

10. An optical scanning system comprising:
    an optical fiber to guide an optical beam to a fiber tip from which the optical beam is emitted;
    a scanning mirror rotatable along at least one axis to steer the optical beam to scan a scene;
    a first lens, disposed between the optical fiber and the scanning mirror, configured with a focal point to focus the optical beam to converge near a center of rotation of the scanning mirror; and
    an optic disposed between the scanning mirror and the scene to collimate or focus the optical beam.

11. The optical scanning system of claim 10, wherein the optical beam is reflected from the first scanning mirror as a divergent optical beam.

12. The optical scanning system of claim 11, wherein the optic comprises a collimating lens to collimate the divergent optical beam from the first scanning mirror to produce a collimated laser beam that is directed toward the scene.

13. The optical scanning system of claim 11, wherein the optic comprises a focus lens to focus the divergent optical beam from the first scanning mirror to produce a focused laser beam that is directed toward the scene.

14. The optical scanning system of claim 11, wherein the optic comprises a focus mirror to collimate the divergent optical beam from the first scanning mirror to produce a collimated laser beam that is directed toward the scene.

15. The optical scanning system of claim 11, wherein the first scanning mirror of the optical scanning system is rotatable along multiple orthogonal axes to steer the optical beam in multiple dimensions to scan the scene.

16. The optical scanning system of claim 11, further comprising a second scanning mirror, wherein the optic is disposed between the first scanning mirror and the second scanning mirror.

17. The optical scanning system of claim 16, wherein the second scanning mirror directs the optical beam toward the scene.

18. The optical scanning system of claim 16, wherein the first scanning mirror and the second scanning mirror are rotatable along orthogonal axes to steer the optical beam in multiple dimensions to scan the scene, the first scanning mirror being rotatable with a faster angular velocity than the second scanning mirror to scan the scene.

19. A method comprising:
- generating, by an optical source, an optical beam;
- directing the optical beam toward a first scanning mirror via an optical fiber;
- focusing, by a first lens, the optical beam near a center of rotation of the first scanning mirror, wherein focusing the optical beam comprises:
  - converging the optical beam near the center of rotation of the scanning mirror based on a focal point of the first lens; and
- collimating or focusing, by an optic, the optical beam as reflected from the first scanning mirror.

20. The method of claim 19, further comprising:
- directing, by a second scanning mirror, the optical beam toward a scene to be scanned by the optical beam.

* * * * *